(12) United States Patent
Peng et al.

(10) Patent No.: US 10,439,625 B2
(45) Date of Patent: Oct. 8, 2019

(54) COMPARATOR AND ANALOG-TO-DIGITAL CONVERTER APPLIED WITH DYNAMIC CURRENT CORRELATING CIRCUIT

(71) Applicant: NATIONAL TAIWAN UNIVERSITY OF SCIENCE AND TECHNOLOGY, Taipei (TW)

(72) Inventors: Sheng-Yu Peng, Taipei (TW); Hao-Yu Li, Taipei (TW); Tzu-Yun Wang, Taipei (TW); Yang-Jing Huang, Taipei (TW); Zong-Yu Ma, Taipei (TW); Shih-An Yu, Taipei (TW)

(73) Assignee: NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 16/155,552

(22) Filed: Oct. 9, 2018

(65) Prior Publication Data
US 2019/0245547 A1    Aug. 8, 2019

(30) Foreign Application Priority Data
Feb. 7, 2018    (TW) .............................. 107104267 A

(51) Int. Cl.
*H03M 1/34* (2006.01)
*H03M 1/00* (2006.01)
*G05F 3/26* (2006.01)

(52) U.S. Cl.
CPC ............ *H03M 1/002* (2013.01); *G05F 3/262* (2013.01)

(58) Field of Classification Search
CPC .... H03M 1/002; H03M 1/0845; H03M 1/183; H03M 1/12; H03M 1/70; H03H 11/481; H03K 5/2481; H03K 3/012; H03K 3/356043; H03K 3/35613; H03K 3/356182; H03K 3/356191; H03K 3/0231; H03K 5/131
USPC .... 341/135, 136, 155, 164, 165; 327/55, 57, 327/215, 217, 219, 228
See application file for complete search history.

(56) References Cited

U.S. PATENT DOCUMENTS

| | | | | |
|---|---|---|---|---|
| 2002/0196063 | A1* | 12/2002 | Bult ....................... | H03K 3/012 327/211 |
| 2007/0147571 | A1* | 6/2007 | Yu ......................... | H03K 21/023 377/47 |
| 2008/0042692 | A1* | 2/2008 | Gebara ............... | H03K 3/35613 327/65 |

(Continued)

*Primary Examiner* — Linh V Nguyen
(74) *Attorney, Agent, or Firm* — McClure, Qualey & Rodack, LLP

(57) ABSTRACT

A dynamic current correlating circuit is disclosed. The current correlating circuit includes a reset circuit, a first current generating circuit and a second current generating circuit. The reset circuit executes a discharging procedure during a first time interval and executes a charging procedure during a second time interval. The first current generating circuit is electrically connected to the reset circuit. The first current generating circuit generates a first sub-current and a second sub-current during a third time interval according to a first input voltage and a second input voltage and generates a first current after the third time interval. The second current generating circuit is electrically connected to the reset circuit. The second current generating circuit generates a second current according to the first input voltage and the second input voltage after the third time interval.

10 Claims, 4 Drawing Sheets

(56) References Cited

U.S. PATENT DOCUMENTS

| | | | |
|---|---|---|---|
| 2009/0179787 A1* | 7/2009 | Naka | H03K 5/2481 |
| | | | 341/155 |
| 2013/0154737 A1* | 6/2013 | Shu | H03F 3/45 |
| | | | 330/253 |
| 2014/0062621 A1* | 3/2014 | Dai | H03H 11/481 |
| | | | 333/216 |
| 2014/0361917 A1* | 12/2014 | Matsuno | G01R 19/0038 |
| | | | 341/155 |
| 2015/0270845 A1* | 9/2015 | Takayama | H03M 1/0624 |
| | | | 341/155 |
| 2018/0183422 A1* | 6/2018 | Yasotharan | H03K 5/249 |

* cited by examiner

COMPARATOR AND ANALOG-TO-DIGITAL CONVERTER APPLIED WITH DYNAMIC CURRENT CORRELATING CIRCUIT

REFERENCE TO RELATED APPLICATIONS

This Non-provisional application claims priority under 35 U.S.C. § 119(a) on Patent Application No. 107104267 filed in Taiwan on Feb. 7, 2018, the entire contents of which are hereby incorporated by reference.

BACKGROUND

1. Technical Field

The present invention relates to a dynamic current correlating circuit and its applied comparator and analog-to-digital converter.

2. Description of Related Art

Many diseases requiring long-term monitoring, such as heart problems, require long-term monitoring using electrocardiographic devices. However, the oversize monitoring device will not be suitable for users to wear for a long time. With the development of science and technology, the combination of electronic technology and medicine, wearable electrocardiogram device and even implantable heart detection device are developed.

It becomes more and more important that the battery can last for a long time when the volume of the device is getting smaller and smaller. It will cause inconvenience to users if the battery needs to be replaced frequently. In particular, for implantable heart detection devices, it is even more difficult to remove and replace batteries at any time.

In order to prolong the battery life, one of the ways is to increase the battery capacity, but the battery capacity is still limited in limited space. Therefore, in addition to increasing the storage capacity of batteries, reducing the power consumption of electronic components is also one of the key technologies of the industry.

Generally, in such electronic devices, analog-to-digital converters are required to convert analog signals into digital signals because of digitization. Analog-to-digital converters are usually composed of logic circuits including comparators and logic gates. Under normal conditions, using fewer logic circuits will reduce power consumption. It is therefore an important subject of the invention to provide an analog-to-digital converter, which not only can maintain high conversion efficiency, but also reduce power consumption.

SUMMARY OF THE INVENTION

In view of the foregoing, the invention is to provide a dynamic current correlating circuit that capable of reducing power consumption and prolonging service time, as well as a comparator and an analog-to-digital converter using the dynamic current correlating circuit.

In addition, the invention is to provide a dynamic current correlating circuit that suitable for the wearable or implantable sensor device, as well as a comparator and an analog-digital converter using the dynamic current correlating circuit.

To achieve the above, the present invention is to provide a dynamic current correlating circuit, which includes a reset circuit, a first current generating circuit and a second current generating circuit. The reset circuit executes a discharge program at the first time and a charge program at the second time. The first current generating circuit is electrically connected to the reset circuit, generates a first sub-current and a second sub-current at a third time, then generates a first current after the third time according to a first input voltage and a second input voltage. The second current generating circuit is electrically connected to the reset circuit, and generates a second current after the third time according to the first input voltage and the second input voltage.

In addition, to achieve the above, the present invention is to provide a comparator comprising a dynamic current correlating circuit, a first latch circuit and a second latch circuit. The dynamic current correlating circuit includes a reset circuit, a first current generating circuit and a second current generating circuit. The reset circuit executes a discharge program at a first time and performs a charge program at a second time. The first current generating circuit is electrically connected to the reset circuit, generates a first sub-current and a second sub-current at a third time, then generates a first current after the third time according to a first input voltage and a second input voltage. The second current generating circuit is electrically connected to the reset circuit, and generates a second current after the third time according to the first input voltage and the second input voltage. The first latch circuit is electrically connected to the dynamic current correlating circuit, generates a first sub-voltage and a second sub-voltage, then generates a first output voltage and a second output voltage according to the first sub-current and the second sub-current. The second latch circuit is electrically connected to the dynamic current associated circuit, and generates a first voltage and a second voltage, thus generates a first bypass trigger voltage and a second bypass trigger voltage according to the first current and the second current.

According to one of the embodiments of the invention, the comparator also includes an adjustable delay circuit, which is electrically connected between the second latch circuit and the dynamic current correlating circuit to control the rise time of the first voltage and/or the second voltage. The adjustable delay circuit may include at least one capacitor that electrically connected between the first voltage and a first reference voltage, or electrically connected between the second voltage and a first reference voltage. Wherein, the capacitors can be electrolytic capacitors, organic capacitors, electromechanical capacitors or semiconductor capacitors, and the semiconductor capacitors can be, e.g. metal-oxide-semiconductor capacitor (MOSC).

Further, to achieve the above, the present invention is to provide an analog-to-digital converter, including a comparator, a control unit and a bypass switching logic unit. The comparator includes a dynamic current correlating circuit, a first latch circuit and a second latch circuit. The dynamic current correlating circuit includes a reset circuit, a first current generating circuit and a second current generating circuit. The reset circuit executes a discharge program at the first time and a charge program at the second time. The first current generating circuit is electrically connected to the reset circuit, generates a first sub-current and a second sub-current at a third time, then generates a first current after the third time according to the first input voltage and the first second input voltage. The second current generating circuit is electrically connected to the reset circuit, and generates a second current after the third time according to the first input voltage and the second input voltage. The first latch circuit is electrically connected with the dynamic current correlating circuit, generates a first sub-voltage and a second sub-voltage, then generates a first output voltage and a second output voltage according to the first sub-current and the second sub-current. The second latch circuit is electrically connected to the dynamic current correlating circuit, generates a first voltage and a second voltage, then generates a first bypass trigger voltage and a second bypass trigger voltage according to the first current and the second current. The control unit is electrically connected to the comparator and receives the first output voltage, the second output voltage, the first bypass trigger voltage and the second bypass trigger voltage, and outputs a bypass trigger signal and a ready signal. The bypass switching logic unit system is electrically connected to the control unit and generates a series of digital control signals sequentially according to the bypass triggering signals and the ready signal.

According to one of the embodiments of the invention, wherein when the difference between the first input voltage and the second input voltage is smaller, the current value of the first current will become larger and the current value of the second current will become smaller. On the contrary, when the difference between the first input voltage and the second input voltage is larger, the current value of the first current will become smaller and the current value of the second current will become larger.

According to one of the embodiments of the invention, wherein, the first current generating circuit and the second current generating circuit are respectively composed of a plurality of P-MOSFETs, or respectively composed of a plurality of N-MOSFETs.

According to one of the embodiments of the invention, wherein the bypass switching logic unit includes a first sub-logic circuit, i.e., a second sub-logic circuit. The first sub-logic circuit has a plurality of serially connected first digital signal generating circuits, which outputs a set of first sub-control signals, when the output of one of these first digital signal generating circuits is 0, the first digital signal generating circuit in series after it stops operating. The second sub-logic circuit has a plurality of serially connected second digital signal generating circuits, which operate in sequence and output a set of second sub-control signals. The set of first sub-control signals and the set of second sub-control signals form the set of digital control signals.

In summary, according to a dynamic current correlating circuit of the present invention, as well as a comparator and an analog-to-digital converter using the dynamic current correlating circuit in the present invention, the analog-to-digital converter can be realized by using a dynamic current correlating circuit with a reset circuit and a set of comparators. Therefore, the use of extremely simplified electronic components to complete the analog-to-digital converter, reducing the use of hardware components can effectively reduce power consumption, so as to prolong the use time of electronic products for its applications.

The detailed technology and preferred embodiments implemented for the subject invention are described in the following paragraphs accompanying the appended drawings for people skilled in this field to well appreciate the features of the claimed invention.

BRIEF DESCRIPTION OF THE DRAWINGS

The parts in the drawings are not necessarily drawn to scale, the emphasis instead being placed upon clearly illustrating the principles of at least one embodiment. In the drawings, like reference numerals designate corresponding parts throughout the various diagrams, and all the diagrams are schematic.

DETAILED DESCRIPTION

Reference will now be made to the drawings to describe various inventive embodiments of the present disclosure in detail, wherein like numerals refer to like elements throughout.

Figure 1:
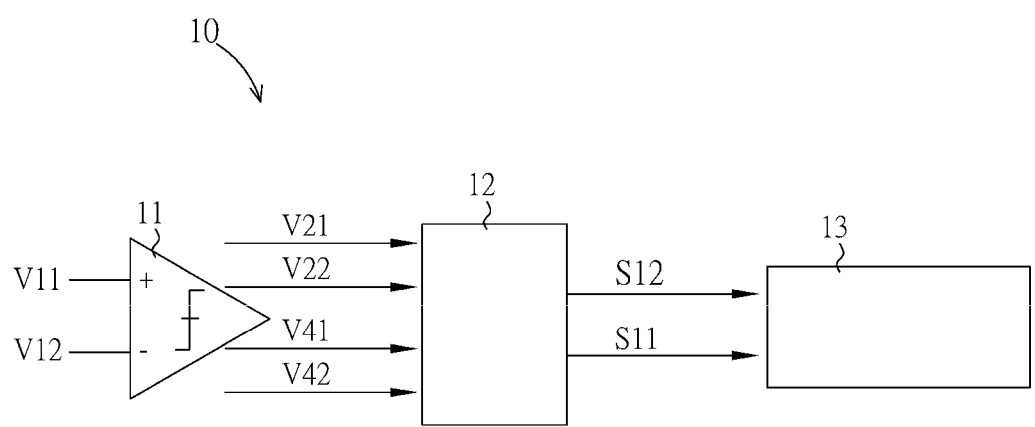
FIG. 1 is a block diagram of an analog-to digital converter according to a preferred embodiment of the present invention.

As shown in FIG. 1, one of the preferred embodiments of the invention is an analog-to-digital converter 10, which includes a comparator 11, a control unit 12 and a bypass switching logic unit 13. The analog-to-digital converter 10 can be applied to a wearable device or an implantable device, and can be used for the conversion of measurement signals such as electrocardiogram (ECG), electrooculogram (EOG), electromyography (EMG), etc.

Figure 2:
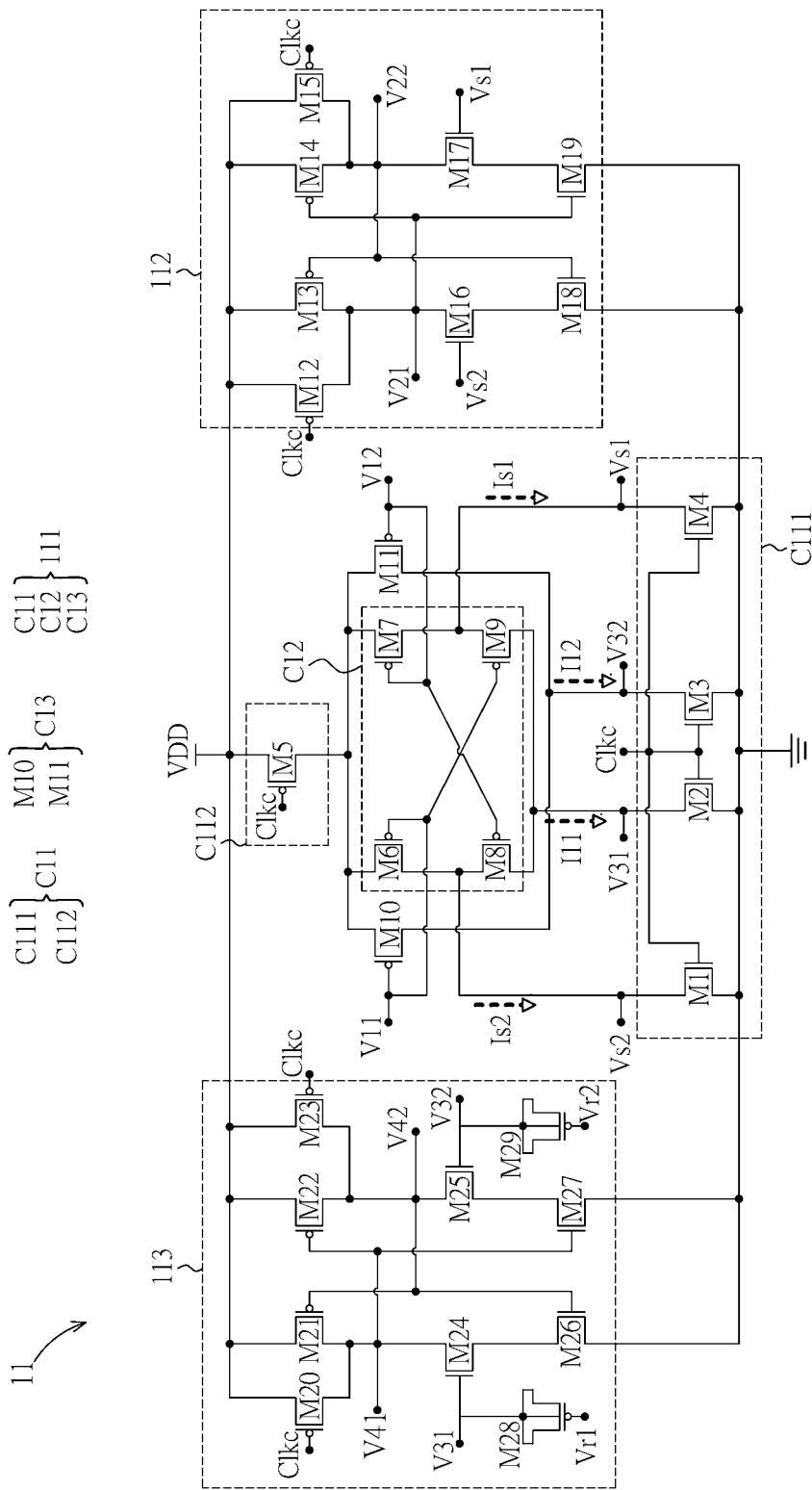
FIG. 2 is a schematic diagram of circuit architecture of a comparator utilized in the analog-to digital converter according to the preferred embodiment of the present invention.

As shown in FIG. 2, one of the preferred embodiments of the invention is a schematic diagram of the circuit structure of the comparator used in the analog-to-digital converter. The comparator 11 includes a dynamic current correlating circuit 111, a first latch circuit 112 and a second latch circuit 113.

The dynamic current correlating circuit 111 includes a reset circuit C11, a first current generating circuit C12 and a second current generating circuit C13. The reset circuit C11 executes a discharge program at the first time and a charge program at the second time. In this embodiment, the reset circuit C11 includes a discharging circuit C111 and a charging circuit C112, in other words, the reset circuit C11 enables the discharging circuit C111 and disenables a energetic charging circuit C112 at the first time, and enables the charging circuit C112 and disenables the discharging circuit C111 at the second time.

The discharging circuit C111 is composed of four N-MOSFETs M1, M2, M3 and M4, its source is electrically connected to a grounding terminal. The charging circuit C112 includes a P-MOSFET M5, which is turned on when the charge program is executed at the second time, to provide a power supply to a circuit electrically connected with it.

The first current generating circuit C12 and the second current generating circuit C13 are electrically connected between the discharging circuit C111 of the reset circuit C11 and the charging circuit C112 of the reset circuit C11.

The first current generating circuit C12 consists of four PMOS transistors M6, M7, M8 and M9, which are electrically connected between the discharge circuit C111 and the charge circuit C112. The first current generating circuit C12 generates the first current Is1 and the second current Is2 at the third time, and then generates the first current I11 after the third time, according to a first input voltage V11 and a second input voltage V12.

The second current generating circuit C13 consists of two PMOS transistors M10 and M11, which are also electrically connected between the discharge circuit C111 and the charge circuit C112. The second current generating circuit C13 generates a second current I12 after the third time according to the first input voltage V11 and the second input voltage V12.

The first input voltage V11 and the second input voltage V12 above are the signals measured by the analog-to-digital converter 10 used in wearable or implantable devices, which represent a positive phase signal and a negative phase signal respectively. In this embodiment, according to its circuit architecture, when the difference between the first input voltage V11 and the second input voltage V12 is smaller, the current value of the first current I11 will become larger, and the current value of the second current I12 will become smaller. On the contrary, when the difference between the first input voltage V11 and the second input voltage V12 is larger, the current value of the first current I11 will become smaller, and the current value of the second current I12 will become larger. In other words, the difference between the first current I11 and the second current I12 also changes.

In other embodiments, according to different circuit architectures, when the difference between the first input voltage and the second input voltage is smaller and the current value of the first current is larger, the current value of the second current remains unchanged or increases accordingly. However, When the current value of the second current increases with the current value of the first current, the change degree of the current value of the second current is different from that of the first current. On the contrary, when the difference between the first input voltage and the second input voltage is larger and the current value of the first current is smaller, the current value of the second current remains unchanged or decreases accordingly. However, when the current value of the second current becomes smaller as the current value of the first current, the change degree of the current value of the second current is different from that of the first current. In short, The difference between the first input voltage and the second input voltage can control the differential change between the first current and the second current.

The first latch circuit 112 is composed of four PMOS transistors M12, M13, M14, M15 and four NMOS transistors M16, M17, M18, M19. The first latch circuit 112 is electrically connected to the dynamic current correlating circuit 111, according to a first sub-voltage Vs1 and a second sub-voltage Vs2 generated by the first sub-current Is1 and the second sub-current Is2, then generates a first output voltage V21 and a second output voltage V22.

The second latch circuit 113 is composed of four PMOS transistors M20, M21, M22, M23, four NMOS transistors M24, M25, M26, M27 and two P-MOSFETs M28, M29. The second latch circuit 113 is electrically connected to the dynamic current correlating circuit 111, according to a first voltage V31 and a second voltage V32 generated by the first current I11 and the second current I12, then generates a first bypass trigger voltage V41 and a second bypass trigger voltage V42.

Wherein, the P-MOSFETs M28 and M29 are components of an adjustable delay circuit. In other embodiments, it may be replaced by an electrolytic capacitor, an organic capacitor, an inorganic capacitor, or other semiconductor capacitor. In addition, according to the above circuit architecture, in the present embodiment, the first latch circuit 112 can be named as a polarity comparison latch circuit, and the second latch circuit 113 can be named as a proximity detection latch circuit.

In this embodiment, P-MOSFETs M28 and M29 are selected since the capacitance value relative to its gate in the positive voltage region is more gentle than that of N-MOSFETs. In addition, the gate of P-MOSFET M28 receives a first reference voltage Vr1, and the gate of P-MOSFET M29 receives a second reference voltage Vr2. By adjusting the level of the first reference voltage Vr1 and the second reference voltage Vr2, the rise time of at least one of the first voltage V31 and the second voltage V32 can be adjusted, and then the bypass critical range of the analog-to-digital converter 10 can be adjusted, when the first input voltage V11 and the second input voltage V12 fall within the critical range of the bypass, it will enter a bypass program, and its details will be described later.

The operation mode of the above comparator 11 is briefly described as follows. When the discharge program is executed at the first time, the PMOS transistor M5 of the charging circuit C112 that controlled by a second frequency signal Clkc is been turned off, while four NMOS transistors M1, M2, M3, and M4 of the discharging circuit C111 are turned on to electrically connect the grounding terminal and conduct the charges in the first current generating circuit C12 and second current generation circuit C13 is transmitted to the grounding terminal, making a first sub-voltage Vs1, a second sub-voltage Vs2, a first voltage V31 and a second voltage V32 in the circuit are low potential. In addition, the two PMOS transistors M12 and M15 of the first latch circuit 112 and the two PMOS transistors M20 and M23 of the second latch circuit 113 are also turned on, making the first bypass trigger voltage V41, the second bypass trigger voltage V42, the first output voltage V21, and the second output voltage V22 are high potential. When the charging process is executed at the second time, the four NMOS transistors M1, M2, M3, M4 of the discharge circuit C111 controlled by the second frequency signal Clkc are been turned off, and the PMOS transistor M5 of the charging circuit C112 is turned on to provide a power VDD to the first current generating circuit C12 and the second current generating circuit C13.

In summary, the above first time and the second time are referred to as a reset phase, and the above first sub-voltage Vs1, the second sub-voltage Vs2, the second voltage V32, and the first voltage V31 are referred to as a first-stage output, the first bypass trigger voltage V41, the second bypass trigger voltage V42, the second output voltage V22 and the first output voltage V21 are referred to as a second-stage output.

The input of the first sub-voltage Vs1 and the second sub-voltage Vs2 of the first latch circuit 112 comes from the drain of the PMOS transistors M6 and M7 of the dynamic current correlating circuit 111. When the charging program starts, as the PMOS transistors M8 and M9 are in the turn-off state, and the PMOS transistors M6 and M7 operate as pseudo-differential pairs, resulting in polarity comparison results. The first voltage V31 and the second voltage V32 received by the second latch circuit 113 depend on the current values of the first current I11 and the second current I12, as well as the capacitance values of the corresponding P-MOSFETs M28 and M29. In this embodiment, when the input voltage difference between the first input voltage V11 and the second input voltage V12 is small, the first voltage V31 will charge faster than the second voltage V32. Therefore, the second bypass trigger voltage V42 output from the second latch circuit 113 maintains a high potential, while the first bypass trigger voltage V41 converts to a low potential.

Figure 3:
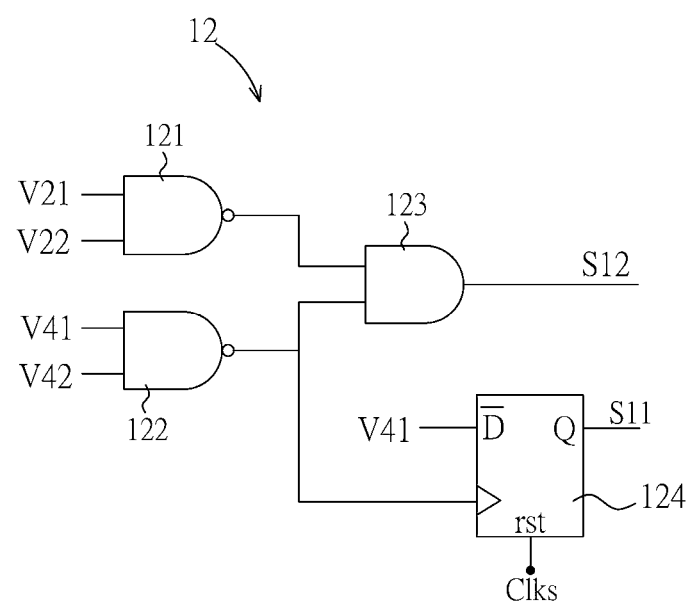
FIG. 3 is a schematic diagram of circuit architecture of a control unit utilized in the analog-to digital converter according to the preferred embodiment of the present invention.

As shown in FIG. 3, is a schematic diagram of the circuit structure of the control unit used in the analog-to-digital converter according to one of the preferred embodiments of the invention. The control unit 12 is electrically connected to the comparator 11 and receives the first output voltage V21, the second output voltage V22, the first bypass trigger voltage V41 and the second bypass trigger voltage V42, according to which a bypass trigger signal S11 and a ready signal S12 are output. In this embodiment, the control unit 12 system includes at least two NAND gates 121 and 122, one AND gate 123, and one flip-flop 124. The flip-flop 124 has an input terminal, an output terminal, a frequency input terminal and a reset input terminal. The output terminals of the NAND gate 121 and NAND gate 122 are electrically connected to the input terminals of the AND gate 123 respectively, according to which the AND gate 123 outputs the ready signal S12. In addition, the output terminal of the AND gate 123 is electrically connected to the frequency input of the flip-flop 124, and the reset input terminal of the flip-flop 124 receives a first frequency signal Clks. The flip-flop 124 outputs the bypass trigger signal S11 according to the first bypass trigger voltage V41, the output of the NAND gate 122, and the first frequency signal Clks.

Figure 4:
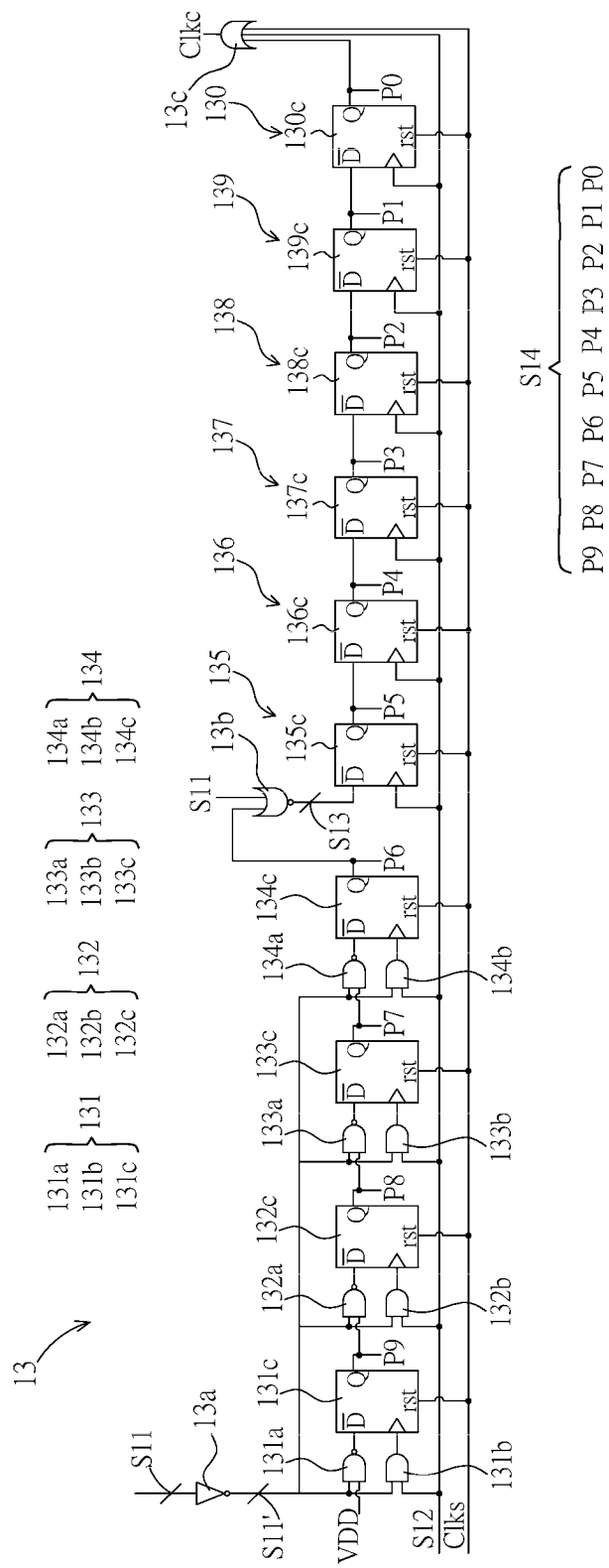
FIG. 4 is a schematic diagram of circuit architecture of a bypass switching logic unit utilized in the analog-to digital converter according to the preferred embodiment of the present invention.

As shown in FIG. 4, is a schematic diagram of the circuit structure of the bypass switching logic unit used in the analog-to-digital converter according to one of the preferred embodiments of the invention. The bypass switching logic unit 13 is electrically connected to the control unit 12, and a set of digital control signals S14 is sequentially generated according to the bypass trigger signal S11, the ready signal S12 and the first frequency signal Clks. In this embodiment, the bypass switching logic unit 13 is composed of a NOT gate 13a, a NOR gate 13b, an OR gate 13c, and a 10 stage digital signal generating circuit. The 10 stage digital signal generating circuit includes a first digital signal generating circuit 131, a second digital signal generating circuit 132, a third digital signal generating circuit 133, a fourth digital signal generating circuit 134, a fifth digital signal generating circuit 135, a sixth digital signal generating circuit 136, and a seventh digital signal generating circuit 137, an eighth digital signal generating circuit 138, a ninth digital signal generating circuit 139 and a tenth digital signal generating circuit 130.

The first digital signal generating circuit 131 to the fourth digital signal generating circuit 134 has a first AND gate 131a, 132a, 133a, 134a and a second AND gate 131b, 132b, 133b, 134b, and a flip-flop 131c, 132c, 133c, 134c, respectively. The fifth to tenth digital signal generating circuits 135 to 130 respectively have a flip-flop 135c, 136c, 137c, 138c, 139c, 130c. In this embodiment, the above-mentioned flip-flop is a D-type flip-flop, but this is not a limitation.

Each of the above flip-flops 131c-130c have an input terminal, an output terminal, a frequency input terminal and a reset input terminal. Each reset input terminal receives a first frequency signal Clks. The NOT gate 13a outputs a reverse bypass trigger signal S11' to the first digital signal generating circuit 131 to the fourth digital signal generating circuit 134 according to the bypass trigger signal S11. The NOR gate 13b outputs a comparison signal S13 to the input terminal of the flip-flop 135c of the fifth digital signal generating circuit 135 according to the bypass trigger signal S11 and the output signals of the output terminals of the flip-flop 134c of the fourth digital signal generating circuit 134. The OR gate 13c outputs a second frequency signal Clkc according to the output signal of the output terminal of the flip-flop 130c of the tenth digital signal generating circuit 130, the ready signal S12 and the first frequency signal Clks.

An input terminal of the first AND gate 131a of the first digital signal generating circuit 131 receives the reverse bypass triggering signal S11', and its other input terminal receives the power VDD, the first digital signal generating circuit 131 generates an output signal to an input of the flip-flop 131c according to the reverse bypass triggering signal S11' and the power VDD. An input terminal of the second AND gate 131b of the first digital signal generating circuit 131 receives the reverse bypass triggering signal S11', and its other input terminal receives the ready signal S12, the first digital signal generating circuit 131 generates an output signal to the frequency input of the flip-flop 131c according to the reverse bypass triggering signal S11' and the ready signal S12. The flip-flop 131c outputs a first sub-control signal P9 from the output terminal according to the output signal of the first AND gate 131a, the output signal of the second AND gate 131b and the first frequency signal Clks.

The other input terminal of the first AND gate 132a of the second digital signal generating circuit 132 receives the first sub-control signal P9 outputted by the flip-flop 131c of the first digital signal generating circuit 131. The output terminal of the first AND gate 132a is electrically connected to the input of the flip-flop 132c. An input terminal of the second AND gate 132b receives the reverse bypass triggering signal S11', its other input terminal receives the ready signal S12, the second AND gate 132b generates an output signal to the frequency input of the flip-flop 132c according to the reverse bypass triggering signal S11' and the ready signal S12. The flip-flop 132c outputs a second sub-control signal P8 from the output terminal according to the output signal of the first AND gate 132a, the output signal of the second AND gate 132b and the first frequency signal Clks.

The other input terminal of the first AND gate 133a of the third digital signal generating circuit 133 receives the second sub-control signal P8 outputted by the flip-flop 132c of the second digital signal generating circuit 132. The output terminal of the first AND gate 133a is electrically connected to the input of the flip-flop 133c. An input terminal of the second AND gate 133b receives the reverse bypass triggering signal S11', and its other input terminal receives the ready signal S12, the second AND gate 133b generates an output signal to the frequency input of the flip-flop 133c according to the reverse bypass triggering signal S11' and the ready signal S12. The flip-flop 133c outputs a third sub-control signal P7 from the output terminal according to the output signal of the first AND gate 133a, the output signal of the second AND gate 133b, and the first frequency signal Clks.

The other input terminal of the first AND gate 134a of the fourth digital signal generating circuit 134 receives the third sub-control signal P7 outputted by the flip-flop 133c of the third digital signal generating circuit 133. The output terminal of the first AND gate 134a is electrically connected to the input of the flip-flop 134c. An input terminal of the second AND gate 134b receives the reverse bypass triggering signal S11', and its other input terminal receives the ready signal S12, the second AND gate 134b generates an output signal to the frequency input of the flip-flop 134c according to the reverse bypass triggering signal S11' and the ready signal S12. The flip-flop 134c outputs a fourth sub-control signal P6 from the output terminal according to the output signal of the first AND gate 134a, the output signal of the second AND gate 134b, and the first frequency signal Clks. In addition, the fourth sub-control signal P6 is further transmitted to the other input terminal of the NOR gate 13b.

The input terminal of the flip-flop 135c of the fifth digital signal generating circuit 135 is electrically connected to the output of the NOR gate 13b to receive the comparison signal S13; the frequency input terminal receives the ready signal S12; the reset input terminal receives the first frequency signal Clks. The flip-flop 135c outputs a fifth sub-control signal P5 from the output terminal according to the comparison signal S13, the ready signal S12 and the first frequency signal Clks.

The input terminal of the flip-flop 136c of the sixth digital signal generating circuit 136 is electrically connected to the output of the flip-flop 135c of the fifth digital signal generating circuit 135 to receive the fifth sub-control signal P5; the frequency input terminal receives the ready signal S12; the reset input terminal receives the first frequency signal Clks. The flip-flop 136c outputs a sixth sub-control signal P4 from the output terminal according to the fifth sub-control signal P5, the ready signal S12 and the first frequency signal Clks.

The input terminal of the flip-flop 137c of the seventh digital signal generating circuit 137 is electrically connected to the output of the flip-flop 136c of the sixth digital signal generating circuit 136 to receive the sixth sub-control signal P4; the frequency input terminal receives the ready signal S12; the reset input receives the first frequency signal Clks. The flip-flop 137c outputs a seventh sub-control signal P3 from the output terminal according to the sixth sub-control signal P4, the ready signal S12 and the first frequency signal Clks.

The input terminal of the flip-flop 138c of the eighth digital signal generating circuit 138 is electrically connected to the output of the flip-flop 137c of the seventh digital signal generating circuit 137 to receive the seventh sub-control signal P3; the frequency input terminal receives the ready signal S12; the reset input receives the first frequency signal Clks. The flip-flop 138c outputs an eighth sub-control signal P2 from the output terminal according to the seventh sub-control signal P3, the ready signal S12 and the first frequency signal Clks.

The input terminal of the flip-flop 139c of the ninth digital signal generating circuit 139 is electrically connected to the output of the flip-flop 138c of the eighth digital signal generating circuit 138 to receive the eighth sub-control signal P2; the frequency input terminal receives the ready signal S12; the reset input terminal receives the first frequency signal Clks. The flip-flop 139c outputs a ninth sub-control signal P1 from the output terminal according to the eighth sub-control signal P2, the ready signal S12 and the first frequency signal Clks.

The input terminal of the flip-flop 130c of the tenth digital signal generating circuit 130 is electrically connected to the output of the flip-flop 139c of the ninth digital signal generating circuit 139 to receive the ninth sub-control signal P1; the frequency input terminal receives the ready signal S12; the reset input terminal receives the first frequency signal Clks. The flip-flop 130c outputs a tenth sub-control signal P0 from the output terminal according to the ninth sub-control signal P1, the ready signal S12 and the first frequency signal Clks.

The OR gate 13c outputs a second frequency signal Clkc to the comparator 11 according to the tenth sub-control signal P0, the ready signal S12 and the first frequency signal Clks to control the transistors M1~M5, M12, M15, M20, M23.

In summary, the first sub-control signal P9 to the tenth sub-control signal P0 outputted by the first digital signal generating circuit 131 to the tenth digital signal generating circuit 130 form a digital control signal S14. Wherein the first sub-control signal P9 to the tenth sub-control signal P0 are respectively one of the digital control signals S14, and the first sub-control signal P9 represents the largest digits, and the tenth sub-control signal P0 represents the smallest digits. In other words, in the embodiment, the digital control signal S14 is a 10-bit digital control signal S14. The digital control signal S14 is used to transmit to a digital-to-analog converter to control a capacitor switching array (not shown in figure).

The above-mentioned 10-bit digital signal generating circuits operate in sequence. In short, the second digital signal generating circuit 132 will operate according to the output of the first digital signal generating circuit 131, the third digital signal generating circuit 133 will operate according to the output of the second digital signal generating circuit 132, and so on. The bypass switching logic unit 13 of the invention is a continuous approximation digital signal generation circuit. However, according to the architecture of its digital signal generation circuit, the operation of the first digital signal generation circuit 131 to the fourth digital signal generation circuit 134 will effectively reduce power consumption. The reason is that, the first sub-control signal P9 outputted by the first digital signal generating circuit 131 represents the largest number of the digits, and the energy consumption required for the capacitor array to be driven is the largest, and the energy consumption required for the capacitor array to be driven is the smallest in sequence down to the tenth sub-control signal P0. In the first digital signal generating circuit 131 to the fourth digital signal generating circuit 134 of the bypass switching logic unit 13 of the present embodiment, when the output of one of the digital signal generating circuits is 0, the remaining digital signal generating circuits of the subsequent digitals are no longer operated. For example, when the first sub-control signal P9 outputted by the first digital signal generating circuit 131 is 0, the second sub-control signal P8, the third sub-control signal P7 and the fourth sub-control signal P6 outputted by the second digital signal generating circuit 132, the third digital signal generating circuit 133, and the fourth digital signal generating circuit 134 are all 0. This result shows that the analog-to-digital converter 10 in these four stages, since the first input voltage V11 and the second input voltage V12 of the comparator 11 fall within the bypass critical range, and thus enter the bypass program without operation, thus reducing power consumption.

In summary, the analog-to-digital converter 10 according to the preferred embodiment of the present invention uses only one set of comparators, together with a control unit and a bypass logic unit for signal conversion. By comparing the first input voltage and the second input voltage via the bypass critical range generated by the designed dynamic current correlating circuit, it is controlled whether or not the subsequent stage executes the bypass program. Based on this, a simplified logic circuit is designed to optimize the overall power consumption and minimize the power consumption by switching the control switch. As a result, when the analog-to-digital converter is applied to wearable sensors or implantable sensors, it will be able to extend its use time without frequent replacement of the device or replacement of the battery.

Even though numerous characteristics and advantages of certain inventive embodiments have been set out in the foregoing description, together with details of the structures and functions of the embodiments, the disclosure is illustrative only. Changes may be made in detail, especially in matters of arrangement of parts, within the principles of the present disclosure to the full extent indicated by the broad general meaning of the terms in which the appended claims are expressed.

What is claimed is:

1. A comparator, which comprises:
   a dynamic current correlating circuit, which comprises:
   a reset circuit, which executes a discharge program at a first time and a charge program at a second time;
   a first current generating circuit, which is electrically connected to the reset circuit, generates a first sub-current and a second sub-current at a third time in accordance with a first input voltage and a second input voltage, then generates a first current after the third time; and
   a second current generating circuit, which is electrically connected to the reset circuit, generates a second current after the third time in accordance with the first input voltage and the second input voltage;
   a first latch circuit, which is electrically connected to the dynamic current correlating circuit, generates a first sub-voltage and a second sub-voltage in accordance with the first sub-current and the second sub-current, then generates a first output voltage and a second output voltage; and
   a second latch circuit, which is electrically connected to the dynamic current correlating circuit, generates a first voltage and a second voltage in accordance with the first current and the second current, then generates a first bypass trigger voltage and a second bypass trigger voltage.

2. The comparator of claim 1, wherein the current value of the first current will become larger and the current value of the second current will become smaller when the difference between the first input voltage and the second input voltage is smaller.

3. The comparator of claim 1, wherein the current value of the first current will become smaller and the current value of the second current will become larger when the difference between the first input voltage and the second input voltage is larger.

4. The comparator of claim 1, further comprising:
   an adjustable delay circuit, which is electrically connected between the second latch circuit and the dynamic current correlating circuit, to control the rise time of the first voltage and/or the second voltage.

5. The comparator of claim 4, wherein the adjustable delay circuit includes at least one capacitor electrically connected between the first voltage and the first reference voltage, or electrically connected between the second voltage and the second reference voltage.

6. An analog-to-digital converter comprising:
   a comparator, which comprises:
   a dynamic current correlating circuit, which comprises:
   a reset circuit, which executes a discharge program at a first time and performs a charge program at a second time;
   a first current generating circuit, which is electrically connected to the reset circuit, generates a first sub-current and a second sub-current at a third time in accordance with a first input voltage and a second input voltage, then generates a first current after the third time; and
   a second current generating circuit, which is electrically connected to the reset circuit, generates a second current after the third time in accordance with the first input voltage and the second input voltage;
   a first latch circuit, which is electrically connected to the dynamic current correlating circuit, generates a first sub-voltage and a second sub-voltage in accordance with the first sub-current and the second sub-current, then generates a first output voltage and a second output voltage;
   a second latch circuit, which is electrically connected to the dynamic current associated circuit, generates a first voltage and a second voltage in accordance with the first current and the second current, then generates a first bypass trigger voltage and a second bypass trigger voltage;
   a control unit, which is electrically connected with the comparator, the control unit receives the first output voltage, the second output voltage, the first bypass trigger voltage and the second bypass trigger voltage, and thereby outputs a bypass trigger signal and a ready signal; and
   a bypass switching logic unit, which is electrically connected with the control unit and generates a set of digital control signals in sequence in accordance with the bypass trigger signal, the ready signal and a first frequency signal.

7. The analog-to-digital converter of claim 6, wherein the current value of the first current will become larger and the current value of the second current will become smaller when the difference between the first input voltage and the second input voltage is smaller.

8. The analog-to-digital converter of claim 6, wherein the current value of the first current will become smaller and the current value of the second current will become larger when the difference between the first input voltage and the second input voltage is larger.

9. The analog-to-digital converter of claim 6, wherein the dynamic current correlating circuit further comprising:
   an adjustable delay circuit, which is electrically connected between the second latch circuit and the dynamic current correlating circuit, is to control the rise time of the first voltage and/or the second voltage.

10. The analog-to-digital converter of claim 9, wherein the adjustable delay circuit comprises at least one capacitor electrically connected between the first voltage and the first reference voltage, or electrically connected between the second voltage and the second reference voltage.

* * * * *